(12) United States Patent
Nin

(10) Patent No.: US 7,742,354 B2
(45) Date of Patent: Jun. 22, 2010

(54) RANDOM ACCESS MEMORY DATA RESETTING METHOD

(75) Inventor: Shu-Liang Nin, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 113 days.

(21) Appl. No.: 12/110,359

(22) Filed: Apr. 28, 2008

(65) Prior Publication Data

US 2009/0168579 A1    Jul. 2, 2009

(30) Foreign Application Priority Data

Jan. 2, 2008   (TW) ............................. 97100045 A

(51) Int. Cl.
*G11C 7/00* (2006.01)
(52) U.S. Cl. ................... 365/218; 365/202; 365/210.12
(58) Field of Classification Search ................ 365/222, 365/228, 210.12, 191, 202, 218
See application file for complete search history.

(56) References Cited

U.S. PATENT DOCUMENTS

| | | | |
|---|---|---|---|
| 6,208,577 B1 | 3/2001 | Mullarkey | |
| 6,621,753 B2 * | 9/2003 | Fujimoto et al. | ............ 365/222 |
| 6,741,515 B2 | 5/2004 | Lazar et al. | |
| 6,862,237 B2 * | 3/2005 | Kato | ............ 365/222 |
| 2003/0156489 A1 * | 8/2003 | Takeuchi et al. | ............ 365/233 |
| 2008/0159040 A1 * | 7/2008 | Mochida | ............ 365/222 |

* cited by examiner

*Primary Examiner*—Tuan T Nguyen
*Assistant Examiner*—Toan Le
(74) *Attorney, Agent, or Firm*—Jiang Chyun IP Office

(57) ABSTRACT

A random access memory data resetting method is provided. The method includes following steps. First, a state machine resetting signal is provided to a RAM. Next, the state machine resetting signal is extended for a predetermined time period. Afterwards, a data resetting operation is executed in the RAM within the predetermined time period.

8 Claims, 7 Drawing Sheets

RANDOM ACCESS MEMORY DATA RESETTING METHOD

CROSS-REFERENCE TO RELATED APPLICATION

This application claims the priority benefit of Taiwan application serial no. 97100045, filed on Jan. 2, 2008. The entirety of the above-mentioned patent application is hereby incorporated by reference herein and made a part of this specification.

BACKGROUND OF THE INVENTION

1. Field of the Invention

The present invention is related to a data resetting method, and particularly to a data resetting method for a random access memory having a state machine.

2. Description of Related Art

With the advance of modern technologies, the memory capacity of the dynamic random access memory (DRAM) dramatically increases and thus allows users to process considerable amount of data within a short period of time. In order for the computer system to accelerate processing time, data is often temporarily stored in the DRAM rather than the hard disc.

As far as the existing security technology of the computer system is concerned, data is written in the hard disc and then encrypted to prevent the data from being stolen. However, the DRAM, disposed between the hard disc and the central processing unit (CPU) and served as a volatile storage medium for storing data, does not have the ability to encrypt the stored data. As a result, hackers may directly steal data temporarily stored in the DRAM and need not invade the hard disc to obtain the same. Consequently, data security is compromised.

In addition, a technology called ECC (error correcting code) is adopted and implemented in DRAMs to correct errors in the data. When the DRAM is activated and internal data thereof is not reset at the very beginning of the activation of the DRAM, the internal data thereof thus appears to be unknown, problems would occur in the error correction results.

Although currently resetting pins has already been disposed in some DRAMs, a function of the resetting pin is mere receiving a state machine resetting signal to reset the state machine inside the DRAM. The state machine is only an action management device. Therefore, as far as the existing technologies and the specifications of DRAMs are concerned, there exists no operation of data resetting.

SUMMARY OF THE INVENTION

The present invention is directed to a random access memory (RAM) data resetting method. The method can execute a data resetting operation on the RAM.

The present invention is directed to a RAM data resetting method. The method includes following steps. First, a state machine resetting signal is provided to a RAM. Next, the state machine resetting signal is extended for a predetermined time period. Afterwards, within the predetermined time period, a data resetting operation is executed in the RAM.

According to one feature of the present invention, the data resetting operation includes following steps. First, sense amplifiers in the RAM are disabled, and then a first voltage is provided to bit lines and inversion bit lines in the RAM. Thereafter, word lines in the RAM are enabled.

According to another feature of the present invention, the data resetting operation includes following steps. First, sense amplifiers in the RAM are disabled, and a first voltage is provided to bit lines and inversion bit lines in the RAM. Then, odd-numbered word lines in the RAM are enabled. Next, the enabled odd-numbered word lines are disabled, and a second voltage is provided to the bit lines and the inversion bit lines in the RAM. Afterwards, even-numbered word lines in the RAM are enabled.

According to still a different feature of the present invention, a first voltage or a second voltage is used as a resetting voltage. The resetting voltage is provided to bit lines and inversion bit lines via equalizers in the RAM.

In the present invention, a state machine resetting signal is extended for a predetermined time period, and a data resetting operation is executed in the RAM within the predetermined time period. During the data resetting operation, sense amplifiers in the RAM are disabled first, so that each of the sense amplifiers cannot amplify a potential difference between the bit line and the inversion bit line coupled to the sense amplifier. Next, the first voltage is provided to the bit lines and the inversion bit lines in the RAM and word lines in the RAM are enabled to turn on memory cells coupled to the word lines. Thus, the first voltage is written to the corresponding memory cells via the bit lines and the inversion bit lines to achieve an effect of data resetting.

Moreover, with regard to consistency in data reading, the word lines in the RAM may be divided into two sections, odd-numbered rows and even-numbered rows, to be enabled in turn. When the first voltage is provided to the bit lines and the inversion bit lines in the RAM, the odd-numbered word lines in the RAM are selected to be enabled. When the second voltage is provided to the bit lines and the inversion bit lines in the RAM, the even-numbered word lines in the RAM are selected to be enabled.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
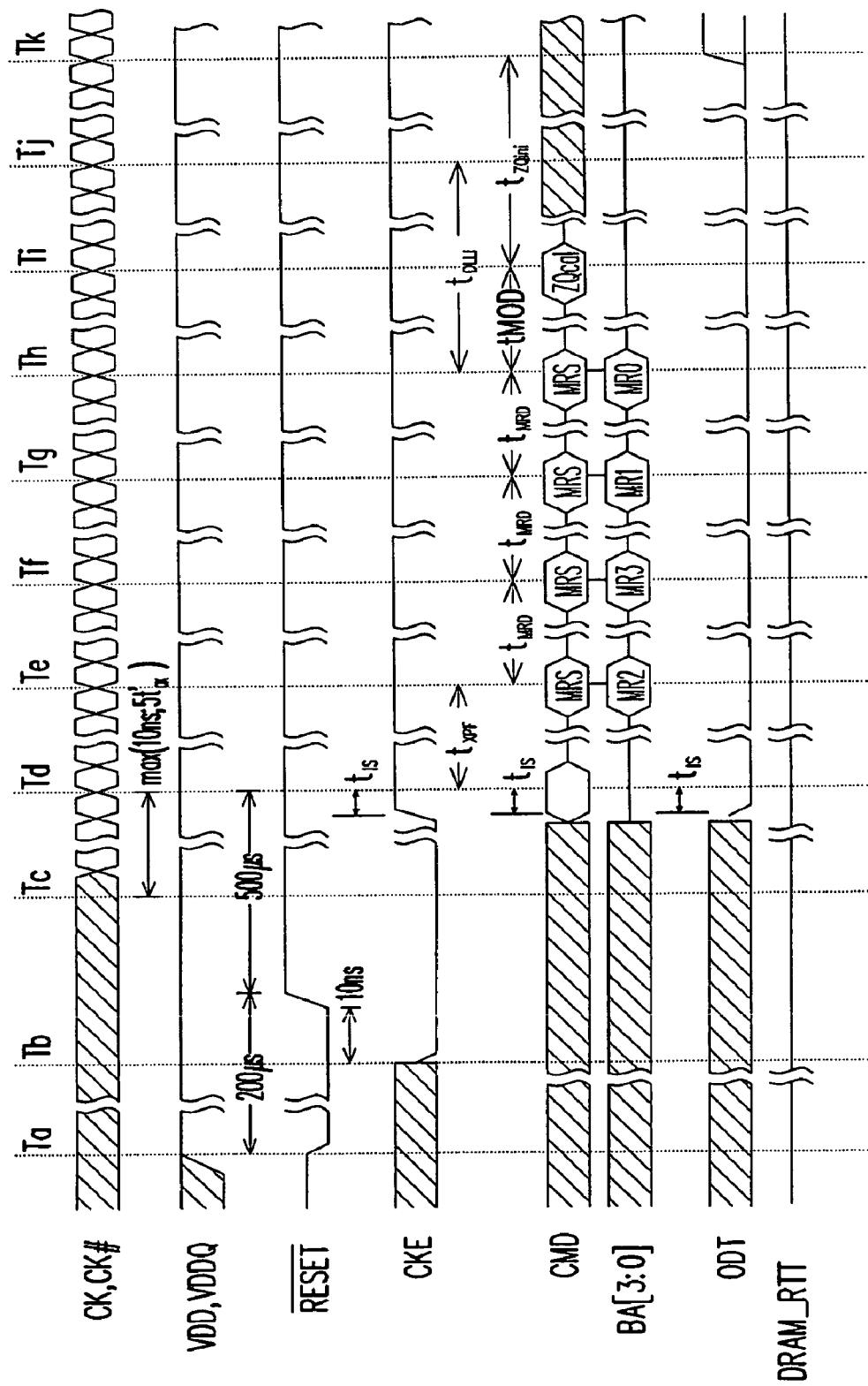
FIG. 1 illustrates a sequence diagram of each inputted signal of a RAM having a state machine.

FIG. 1 is a sequence diagram of each inputted signal from a RAM having a state machine. The RAM is, for example, a dynamic random access memory (DRAM). In FIG. 1, /RESET is a state machine resetting signal inputted to the RAM. When the RAM is activated, the state machine resetting signal /RESET appears to be at a low potential to reset the state machine.

Figure 2:
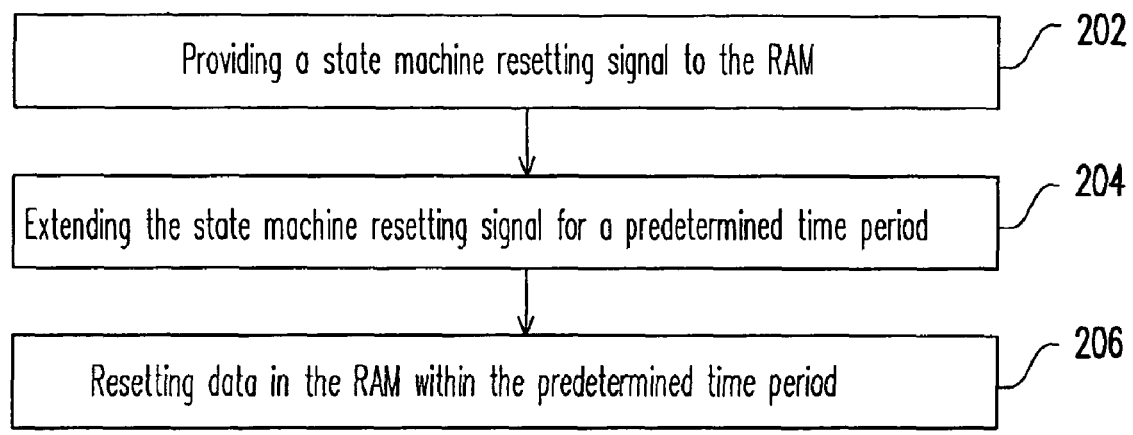
FIG. 2 illustrates a flowchart of a RAM data resetting method according to an embodiment of the present invention.
Figure 3:
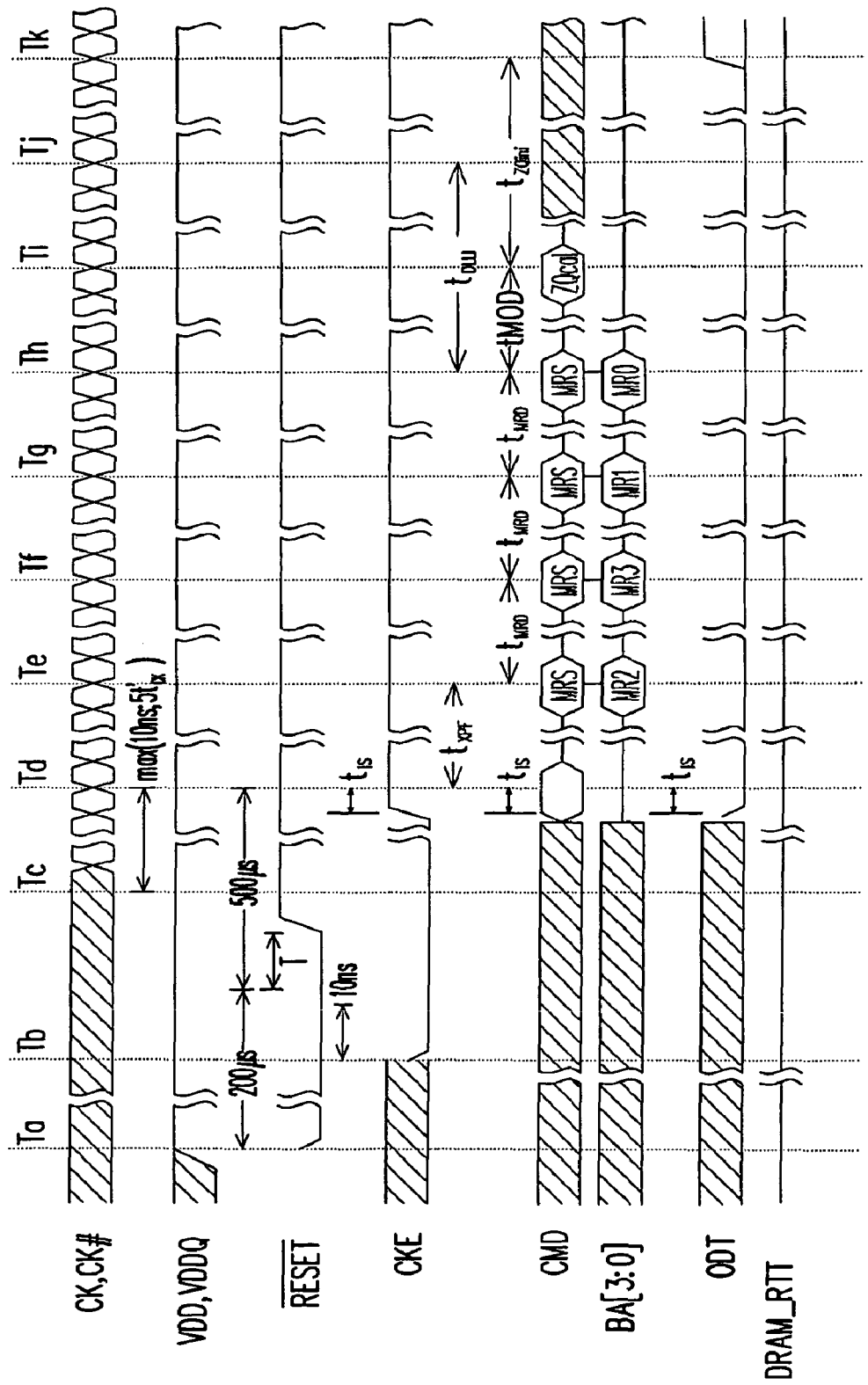
FIG. 3 schematically illustrates a method of extending a state machine resetting signal/RESET.

The present invention is directed to a RAM data resetting method. The method may be applied in the aforementioned RAM. Steps of the method are illustrated in FIG. 2, which is a flowchart of a RAM data resetting method according to an embodiment of the present invention. Referring to FIG. 2, first, a state machine resetting signal is provided to the RAM (illustrated as a step 202 of FIG. 2). Next, the state machine resetting signal is extended for a predetermined time period (illustrated as a step 204 of FIG. 2). A method of extending the state machine resetting signal can be referred to in FIG. 3, which illustrates a schematic view of a method of extending the state machine resetting signal /RESET. As illustrated in FIG. 3, the state machine resetting signal /RESET is extended for a predetermined time period T. A length of the predetermined time period T may be set according to actual requirements. However, it is noticed that the state machine resetting signal /RESET cannot be extended for so long that the RAM cannot operate normally. Referring to FIG. 2 again, afterwards, within the predetermined time period T, a data resetting operation is executed in the RAM (illustrated as a step 206 of FIG. 2). An advantage to executing the data resetting operation within the predetermined time period is that specifications of pins in the RAM are not required to be changed.

Figure 4:
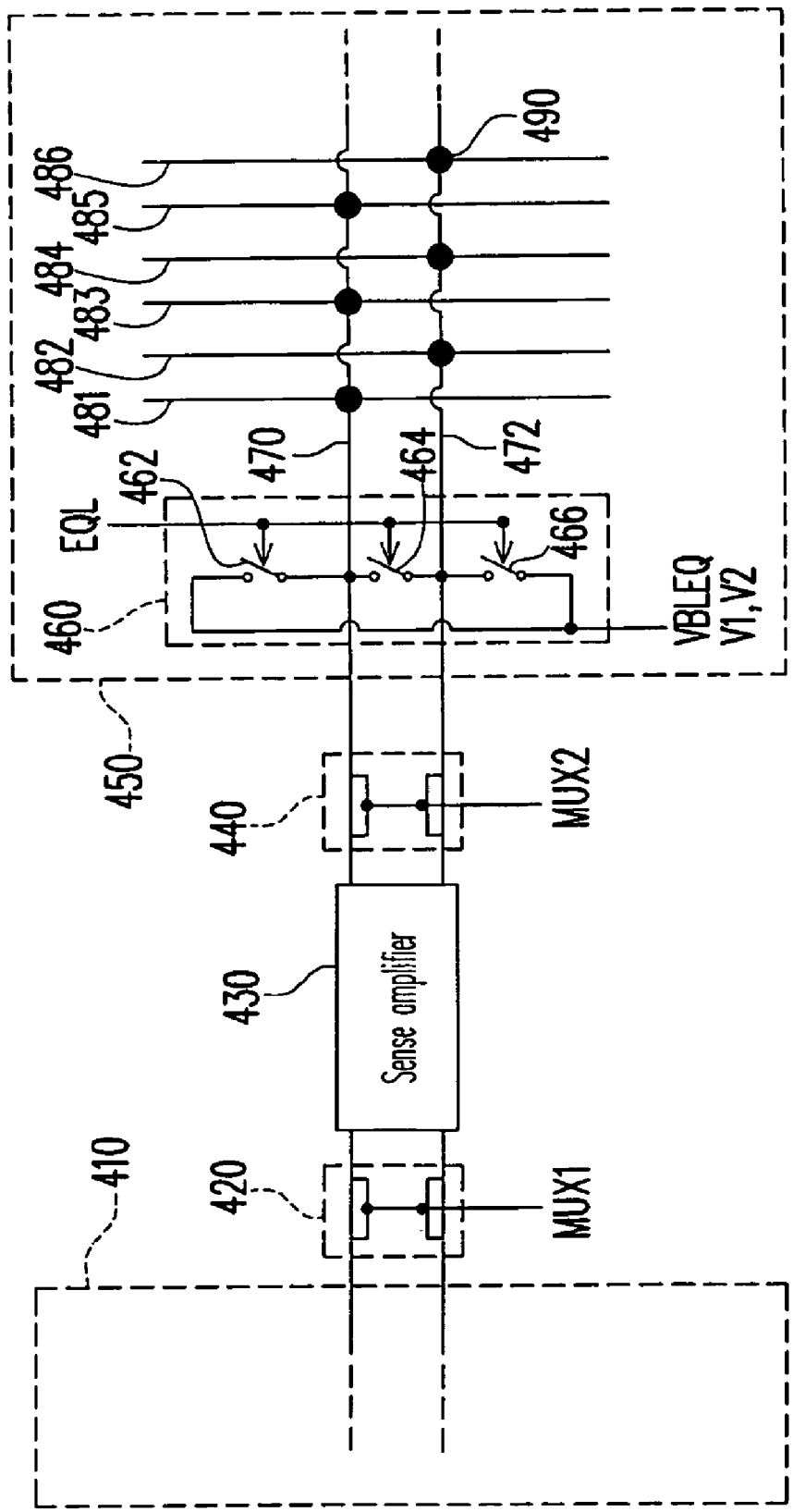
FIG. 4 schematically illustrates a partial structure inside a RAM.

To ensure a clear explanation of the data resetting operation, it is necessary to briefly describe an interior structure of the RAM beforehand. FIG. 4 schematically illustrates a partial internal structure of a RAM. Referring to FIG. 4 first, FIG. 4 illustrates a left-sided memory array 410, disposed switches 420 and 440, a sense amplifier 430 and a right-sided memory array 450. Since the left-sided memory array 410 and the right-sided memory array 450 both use the sense amplifier 430, the disposed switches 420 and 440 determine which memory array may use the sense amplifier 430 according to control signals MUX1 and MUX2 respectively.

Since the structure of the left-sided memory array 410 and the structure of the right-sided memory array 450 are identical, only the right-sided memory array 450 is used as an example for further explanation and only a portion of the structure in the right-sided memory array 450 is described herein. The right-sided memory array 450 as illustrated in FIG. 4 includes an equalizer 460, an inversion bit line 470, a bit line 472, word lines 481-486 and six memory cells (marked as 490). The equalizer 460 further includes three switches marked as 462, 464 and 466 respectively. Whether each of the switches 462, 464 and 466 is turned on is determined by a control signal EQL. When the switches 462, 464 and 466 are turned on, the inversion bit line 470 and the bit line 472 show a potential of a voltage VBLEQ. The switch 464 eliminates a potential difference between the inversion bit line 470 and the bit line 472.

Figure 5:
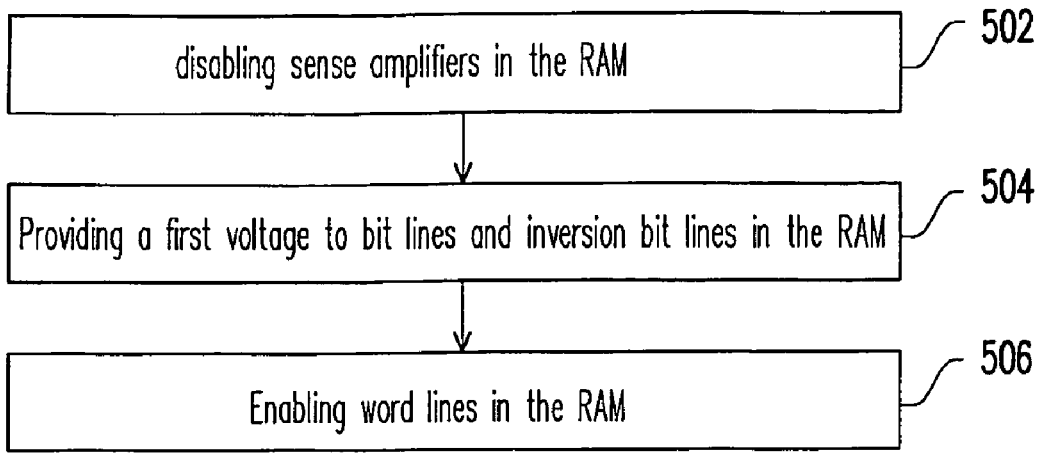
FIG. 5 illustrates a flowchart of executing a data resetting operation according to an embodiment of the present invention.

FIG. 5 illustrates a flowchart of executing a data resetting operation according to an embodiment of the present invention. Please refer to FIGS. 4 and 5 whenever mentioned in the following description. In steps of the data resetting operation, first, the sense amplifier 430 is disabled (illustrated as a step 502 of FIG. 5) so that the sense amplifier 430 cannot amplify the potential difference between the bit line 472 and the inversion bit line 470. Next, the switches 462, 464 and 466 are turned on via the control signal EQL. A voltage V1 replaces the voltage VBLEQ to be provided to the bit line 472 and the inversion bit line 470 (illustrated as a step 504 of FIG. 5). The voltage V1 is, for example, a common voltage (generally indicated as GND). Thereafter, the word lines 481-486 are enabled to turn on the memory cells 490 coupled thereto. Thus, the voltage V1 is written into these memory cells 490 to achieve an effect of data resetting.

During a general data-refreshing operation, a central processing unit (CPU) sends a data-refreshing command to the RAM so that the RAM decodes the data-refreshing command as a refreshed indication pulse and enables a word line accordingly. Hence, when the word lines 481-486 are enabled, a mode of enabling word lines during data refreshing may also be adopted to sequentially enable the word lines 481-486 with a refreshed indication pulse sequence.

Moreover, to ensure consistency in the reset data during reading, the word lines in the RAM may be divided into an odd-numbered section and an even-numbered section to be enabled in turn. When each of the sections is enabled, different resetting voltages are provided to the bit lines and the inversion bit lines respectively, as illustrated by steps in FIG. 6.

Figure 6:
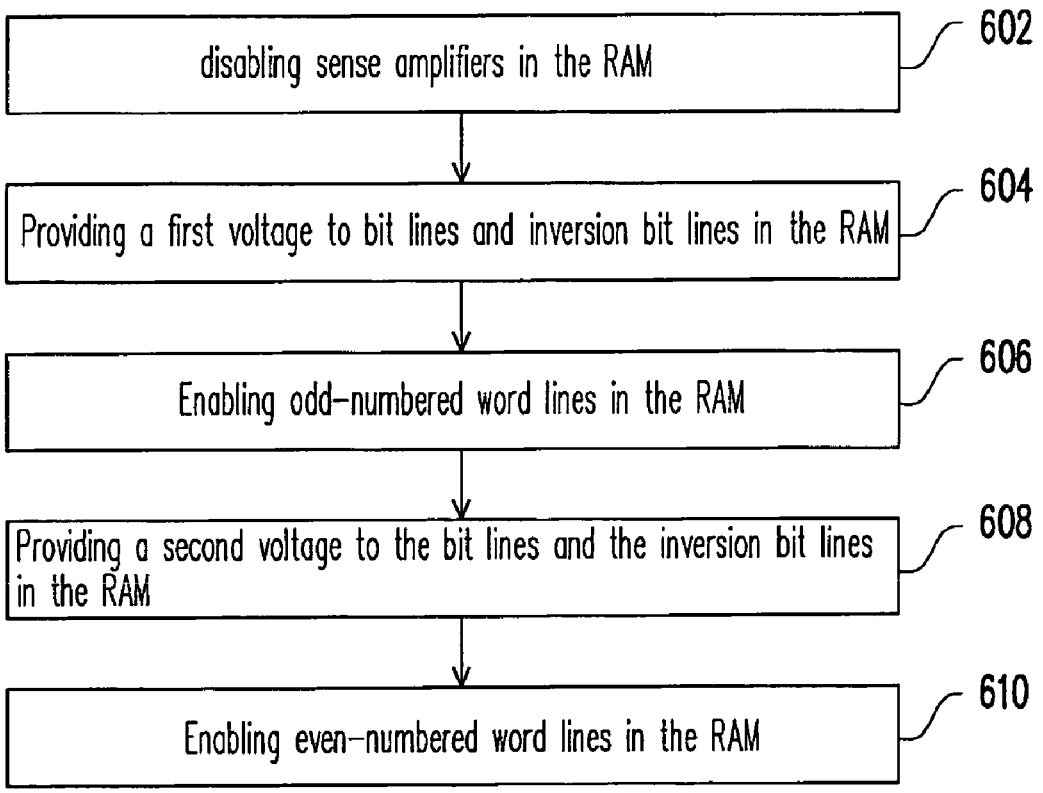
FIG. 6 illustrates a flowchart of executing a data resetting operation according to another embodiment of the present invention.

FIG. 6 illustrates a flowchart of executing a data resetting operation according to another embodiment of the present invention. Referring to FIGS. 4 and 6 simultaneously, first, the sense amplifier 430 is disabled (illustrated as a step 602 of FIG. 6). Afterwards, the switches 462, 464 and 466 are turned on via the control signal EQL. The voltage V1 replaces the voltage VBLEQ and is provided to the bit line 472 and the inversion bit line 470 (illustrated as a step 604 of FIG. 6). The voltage V1 is, for example, a common voltage. Next, the word lines 481, 483 and 485 are sequentially enabled by disabling a word line for every enabled word line. In other words, odd-numbered word lines are enabled (illustrated as a step 606 of FIG. 6) to sequentially turn on the memory cells 490 coupled to the word lines 481, 483 and 485. As a result, the voltage V1 is written into the memory cells 490. Subsequently, a voltage V2 replaces the voltage V1 to be provided to the bit line 472 and the inversion bit line 470 (illustrated as a step 608 of FIG. 6). The voltage V2 is, for example, a supply voltage (generally indicated as VCC). Then, the word lines 482, 484 and 486 are sequentially enabled by disabling a word line for every enabled word line. In other words, even-numbered word lines are enabled (illustrated as a step 610 of FIG. 6) to sequentially turn on the memory cells 490 coupled to the word lines 482, 484 and 486. As a result, the voltage V2 is written into the memory cells 490.

Figure 7:
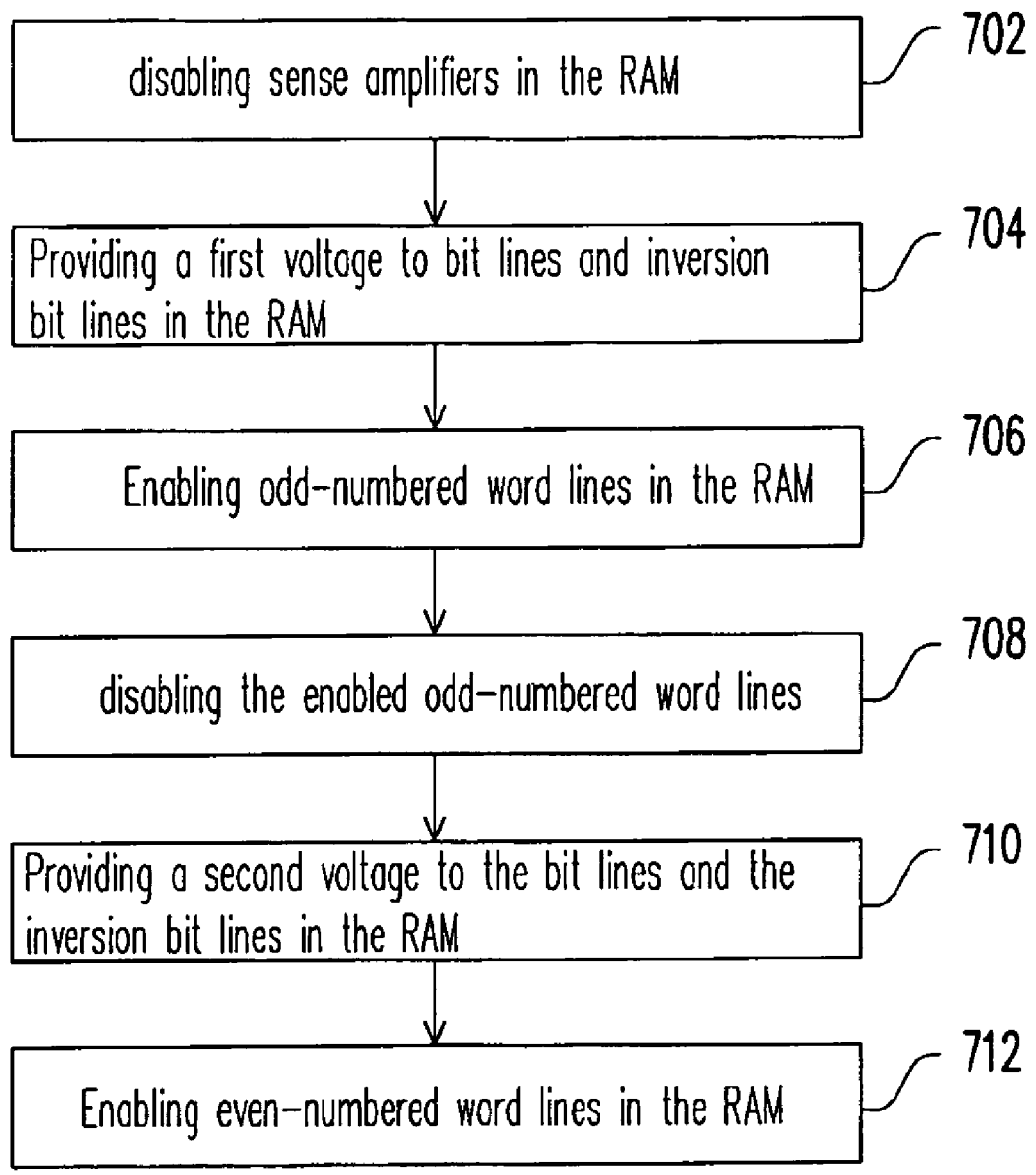
FIG. 7 illustrates a flowchart of executing a data resetting operation according to yet another embodiment of the present invention.

In order for the memory unit 490 coupled to each of the word lines to have enough time for data resetting, a data resetting operation is further provided in the following as illustrated in FIG. 7, which illustrates a flowchart of executing a data resetting operation according to yet another embodiment of the present invention. Referring to FIGS. 4 and 7, first, the sense amplifier 430 is disabled (illustrated as a step 702 of FIG. 7). Afterwards, the switches 462, 464 and 466 are turned on via the control signal EQL. The voltage V1 replaces the voltage VBLEQ to be provided to the bit line 472 and the inversion bit line 470 (illustrated as a step 704 of FIG. 7). The voltage V1 is, for example, a common voltage. Next, the word lines 481, 483 and 485 are sequentially enabled by latching a word line for every enabled word line. In other words, odd-numbered word lines are enabled (illustrated as a step 706 of FIG. 7) to sequentially turn on the memory cells 490 coupled to the word lines 481, 483 and 485. As a result, the voltage V1 is written into the memory cells 490. In the step 706, the enabled word lines are latched to prevent the word lines from being disabled. Therefore, the enabled odd-numbered word lines have to be disabled first (illustrated as a step 708 of FIG. 7). Subsequently, the voltage V1 is replaced by the voltage V2 to be provided to the bit line 472 and the inversion bit line 470 (illustrated as a step 710 of FIG. 7). The voltage V2 is, for example, a supply voltage. Next, the word lines 482, 484 and 486 are sequentially enabled by latching a word line for every enabled word line. In other words, even-numbered word lines are enabled (illustrated as a step 712 of FIG. 7) to sequentially turn on the memory cells 490 coupled with the word lines 482, 484 and 486. As a result, the voltage V2 is written into the memory cells 490.

Although in the foregoing embodiments, the voltages V1 and V2 are provided to the bit line 472 and the inversion bit line 470 via the switches in the equalizer 460, people having ordinary skill in the art should know that the embodiment may also be implemented by directly providing the voltages V1 and V2 to the bit line 472 and the inversion bit line 470. Additionally, when the sense amplifier 430 is disabled, the disposed switches 420 and 440 may also be turned off correspondingly to further ensure that the state of the sense amplifier 430 is disabled. However, if no disposed switch is configured in the RAM, it is not necessary to turn off the disposed switch.

Figure 8:
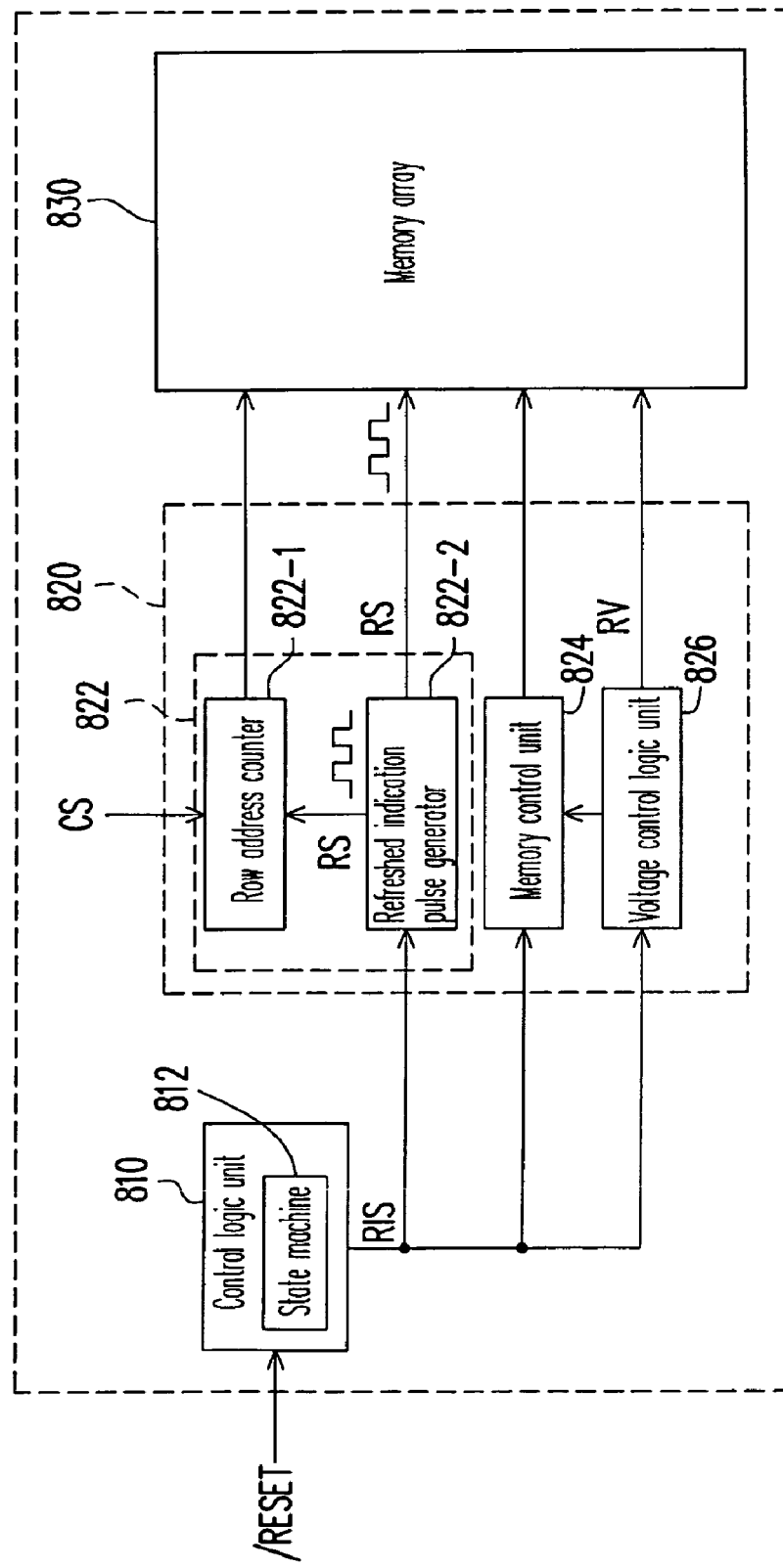
FIG. 8 illustrates a block diagram of a RAM according to an embodiment of the present invention.

From the foregoing teachings, a RAM capable of executing a data resetting operation is further provided as follows, as illustrated in FIG. 8. FIG. 8 is a device block diagram of a RAM according to an embodiment of the present invention and mainly illustrates a device block pertinent to data resetting. As illustrated in FIG. 8, reference numeral 800 is the said RAM, which includes a control logic unit 810, a data resetting unit 820 and a memory array 830. The control logic unit 810 has a state machine 812, and is used for receiving a state machine resetting signal /RESET, extending the state machine resetting signal /RESET for a predetermined time period T and generating a resetting indication signal RIS correspondingly. The data resetting unit 820 is used for executing a data resetting operation on the memory array 830 in response to the resetting indication signal RIS within the predetermined time period T.

The data resetting unit 820 further includes an enablement control unit 822, a memory array control unit 824 and a voltage control logic unit 826. The memory array control unit 824 is used for disabling sense amplifiers in the memory array 830 in response to the resetting indication signal RIS. The voltage control logic unit 826 is used for providing a resetting voltage RV to bit lines and inversion bit lines in the memory array 830 in response to the resetting indication signal RIS. The enablement control unit 822 is used for enabling word lines in the memory array 830 in response to the resetting indication signal RIS.

The said enablement control unit 822 further includes a row address counter 822-1 and a refreshed indication pulse generator 822-2. The refreshed indication pulse generator 822-2 is used for generating a refreshed indication pulse sequence RS in response to the resetting indication signal RIS. The row address counter 822-1 is used for counting word line addresses intended to be enabled in response to the refreshed indication pulse sequence RS. Then, the row address counter 822-1 further determines whether odd-numbered row address counting signal or even-numbered row address counting signal is outputted in response to a control signal CS. One of the odd-numbered rows of word lines is enabled by the memory array 830 in response to each refreshed indication pulse and the odd-numbered row address counting signal. Alternatively, one of the even-numbered rows of word lines is enabled in response to each refreshed indication pulse and the even-numbered row address counting signal.

When the row address counter 822-1 outputs odd-numbered row address counting signal, the voltage control logic unit 826 provides the voltage V1 as the resetting voltage RV to the bit lines and the inversion bit lines in the memory array 830. When the row address counter 822-1 outputs even-numbered row address counting signals, the voltage control logic unit 826 provides the voltage V2 as the resetting voltage RV to the bit lines and the inversion bit lines in the memory array 830.

Certainly, whether the voltage V1 or the voltage V2 is used as the resetting voltage RV, the resetting voltage RV may be provided to the bit lines and the inversion bit lines in the RAM via the equalizers therein. Furthermore, the memory array control unit 824 may also be designed as having a word line latching function. Consequently, whenever a word line is enabled, the memory array control unit 824 may latch the enabled word line. If a disposed switch is configured in the memory array 830, the memory array control unit 824 would disable the sense amplifiers, and turn off the disposed switch as well.

In summary, in the present invention, the state machine resetting signal is extended for a predetermined time period, and then a data resetting operation is executed in the RAM within the predetermined time period. During the data resetting operation, first, the sense amplifiers in the RAM is disabled so that each of the sense amplifiers cannot amplify a potential difference between the bit line and the inversion bit line coupled to the sense amplifier. Next, the first voltage is provided to the bit lines and the inversion bit lines in the RAM and then word lines in the RAM are enabled to turn on the memory cells coupled to the word lines. Thus, the first voltage is written into the corresponding memory cells via the bit lines and the inversion bit lines to achieve an effect of data resetting.

Moreover, as regards the consistency in data reading, the word lines in the RAM may be divided into an odd-numbered section and an even-numbered section to be enabled in turn. When the first voltage is provided to the bit lines and the inversion bit lines in the RAM, the odd-numbered word lines in the RAM are selected to be enabled. When the second voltage is provided to the bit lines and the inversion bit lines in the RAM, the even-numbered word lines in the RAM are selected to be enabled.

Although the present invention has been disclosed above by preferred embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A random access memory data resetting method, the method comprising the steps of:
    providing a state machine resetting signal to a random access memory;
    extending the state machine resetting signal for a predetermined time period; and
    executing a data resetting operation in the random access memory within the predetermined time period,
    wherein the data resetting operation comprises:
    disabling sense amplifiers in the random access memory;
    providing a first voltage to bit lines and inversion bit lines in the random access memory; and enabling word lines or odd-numbered word lines in the random access memory.

2. The method as claimed in claim 1, wherein when the word lines are enabled, the first voltage is provided via equalizers in the random access memory to the bit lines and the inversion bit lines.

3. The method as claimed in claim 1, wherein when the odd-numbered word lines are enabled, the first voltage is provided via equalizers in the random access memory to the bit lines and the inversion bit lines.

4. The method as claimed in claim 1, wherein enabling the odd-numbered word lines step is accomplished via disabling a word line for every enabled word line.

5. The method as claimed in claim 4, wherein the data resetting operation further comprises:
   providing a second voltage to the bit lines and the inversion bit lines in the random access memory; and
   enabling even-numbered word lines in the random access memory.

6. The method as claimed in claim 1, wherein enabling the odd-numbered word lines step is accomplished via latching a word line for every enabled word line.

7. The method as claimed in claim 6, wherein the data resetting operation further comprises:
   disabling the enabled odd-numbered word lines;
   providing a second voltage to the bit lines and the inversion bit lines in the random access memory; and
   enabling even-numbered word lines in the random access memory.

8. The method as claimed in claim 7, wherein the second voltage is provided via equalizers in the random access memory to the bit lines and the inversion bit lines.

* * * * *